United States Patent
Tsukiji

(10) Patent No.: US 11,935,765 B2
(45) Date of Patent: Mar. 19, 2024

(54) LASER PROCESSING APPARATUS

(71) Applicant: DISCO CORPORATION, Tokyo (JP)

(72) Inventor: Shuichiro Tsukiji, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 260 days.

(21) Appl. No.: 17/655,625

(22) Filed: Mar. 21, 2022

(65) Prior Publication Data
US 2022/0310419 A1    Sep. 29, 2022

(30) Foreign Application Priority Data

Mar. 24, 2021 (JP) ................................ 2021-050219

(51) Int. Cl.
*B23K 26/00* (2014.01)
*B23K 26/03* (2006.01)
*H01L 21/67* (2006.01)
*B23K 103/00* (2006.01)

(52) U.S. Cl.
CPC .... *H01L 21/67092* (2013.01); *B23K 26/0006* (2013.01); *B23K 26/032* (2013.01); *H01L 21/67253* (2013.01); *B23K 2103/56* (2018.08)

(58) Field of Classification Search
CPC .............. B23K 26/0006; B23K 26/032; B23K 2103/56; B23K 26/38; B23K 26/702
See application file for complete search history.

(56) References Cited

U.S. PATENT DOCUMENTS

| | | | | |
|---|---|---|---|---|
| 2013/0334186 | A1* | 12/2013 | Nomaru | B23K 26/02 219/121.82 |
| 2015/0287179 | A1* | 10/2015 | Nomaru | G01B 11/306 382/149 |
| 2017/0336263 | A1* | 11/2017 | Hayashi | G01N 21/21 |
| 2018/0257174 | A1* | 9/2018 | Morikazu | B23K 26/0006 |

FOREIGN PATENT DOCUMENTS

JP    2004188475 A    7/2004

* cited by examiner

*Primary Examiner* — Nahida Sultana
*Assistant Examiner* — Mohamed K Ahmed Ali
(74) *Attorney, Agent, or Firm* — Greer Burns & Crain Ltd.

(57) ABSTRACT

A laser processing apparatus includes a main imaging unit configured to image a region to be laser-processed and an auxiliary imaging unit. The auxiliary imaging unit includes an objective lens, a camera configured to generate an image via the objective lens, a half-silvered mirror disposed between the camera and the objective lens, a light source configured to illuminate a wafer held on a chuck table via the half-silvered mirror and the objective lens, a first polarizing plate disposed between the camera and the half-silvered mirror, and a second polarizing plate disposed between the light source and the half-silvered mirror. The second polarizing plate is disposed such that a polarization plane of light applied from the light source, passed through the second polarizing plate, and reflected by the half-silvered mirror is rotated by a required angle with respect to a polarization axis of the first polarizing plate.

4 Claims, 4 Drawing Sheets

LASER PROCESSING APPARATUS

BACKGROUND OF THE INVENTION

Field of the Invention

The present invention relates to a laser processing apparatus that performs laser processing by irradiating a wafer held on a chuck table with a laser beam.

Description of the Related Art

A wafer having devices such as integrated circuits (ICs) or large-scale integration (LSI) circuits formed on a top surface thereof so as to be demarcated by a plurality of intersecting planned dividing lines is divided into individual device chips by a dicing apparatus or a laser processing apparatus. The divided device chips are used in electric apparatuses such as mobile telephones or personal computers.

The laser processing apparatus includes at least a chuck table that holds the wafer, a laser irradiating unit that performs laser processing by irradiating the wafer held on the chuck table with a laser beam, a feed mechanism that processing-feeds the chuck table and the laser irradiating unit relative to each other, an imaging unit that images a region to be laser-processed, and a display unit. The laser processing apparatus can laser-process the wafer with high accuracy (see Japanese Patent Laid-Open No. 2004-188475, for example).

SUMMARY OF THE INVENTION

In a case where a processed groove is to be formed in the top surface of the wafer by ablation processing using the laser processing apparatus, laser processing conditions need to be set appropriately so as to correspond to the material and thickness of the wafer. The state of the processed groove actually formed in the top surface of the wafer may be checked in order to determine whether the settings are appropriate. In a case of imaging the state of the processed groove by using a conventional imaging unit originally provided to the laser processing apparatus and used in an alignment step, because debris produced by the ablation processing adheres to both sides of the processed groove, no distinction between the processed groove and the debris can be made, so that the finished quality of the processed groove cannot be grasped accurately.

It is accordingly an object of the present invention to provide a laser processing apparatus that makes it possible to accurately check the state of a processed groove formed in the top surface of a wafer.

In accordance with an aspect of the present invention, there is provided a laser processing apparatus including a chuck table configured to hold a wafer, a laser irradiating unit configured to perform laser processing by irradiating the wafer held on the chuck table with a laser beam, a feed mechanism configured to processing-feed the chuck table and the laser irradiating unit relative to each other, a main imaging unit configured to image a region to be laser-processed, an auxiliary imaging unit, and a display unit, in which the auxiliary imaging unit includes an objective lens, a camera configured to generate an image via the objective lens, a half-silvered mirror disposed between the camera and the objective lens, a light source configured to illuminate the wafer held on the chuck table via the half-silvered mirror and the objective lens, a first polarizing plate disposed between the camera and the half-silvered mirror, and a second polarizing plate disposed between the light source and the half-silvered mirror, and the second polarizing plate is disposed such that a polarization plane of light applied from the light source, passed through the second polarizing plate, and reflected by the half-silvered mirror is rotated by a required angle with respect to a polarization axis of the first polarizing plate.

Preferably, the auxiliary imaging unit is configured to be able to image a processed groove formed by the laser processing and debris by imaging a laser-processed region of the wafer held on the chuck table. Preferably, the first polarizing plate and the second polarizing plate constituting the auxiliary imaging unit can be selectively positioned at an action position and a non-action position, and constitute the main imaging unit by being positioned at the non-action position. Preferably, the required angle is 90 degrees.

According to the laser processing apparatus in accordance with the present invention, contrast between the processed groove formed by the laser processing and the debris becomes clear, and therefore the finished quality of the processed groove can be checked excellently.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A laser processing apparatus according to an embodiment of the present invention will hereinafter be described in detail with reference to the accompanying drawings.

Figure 1:
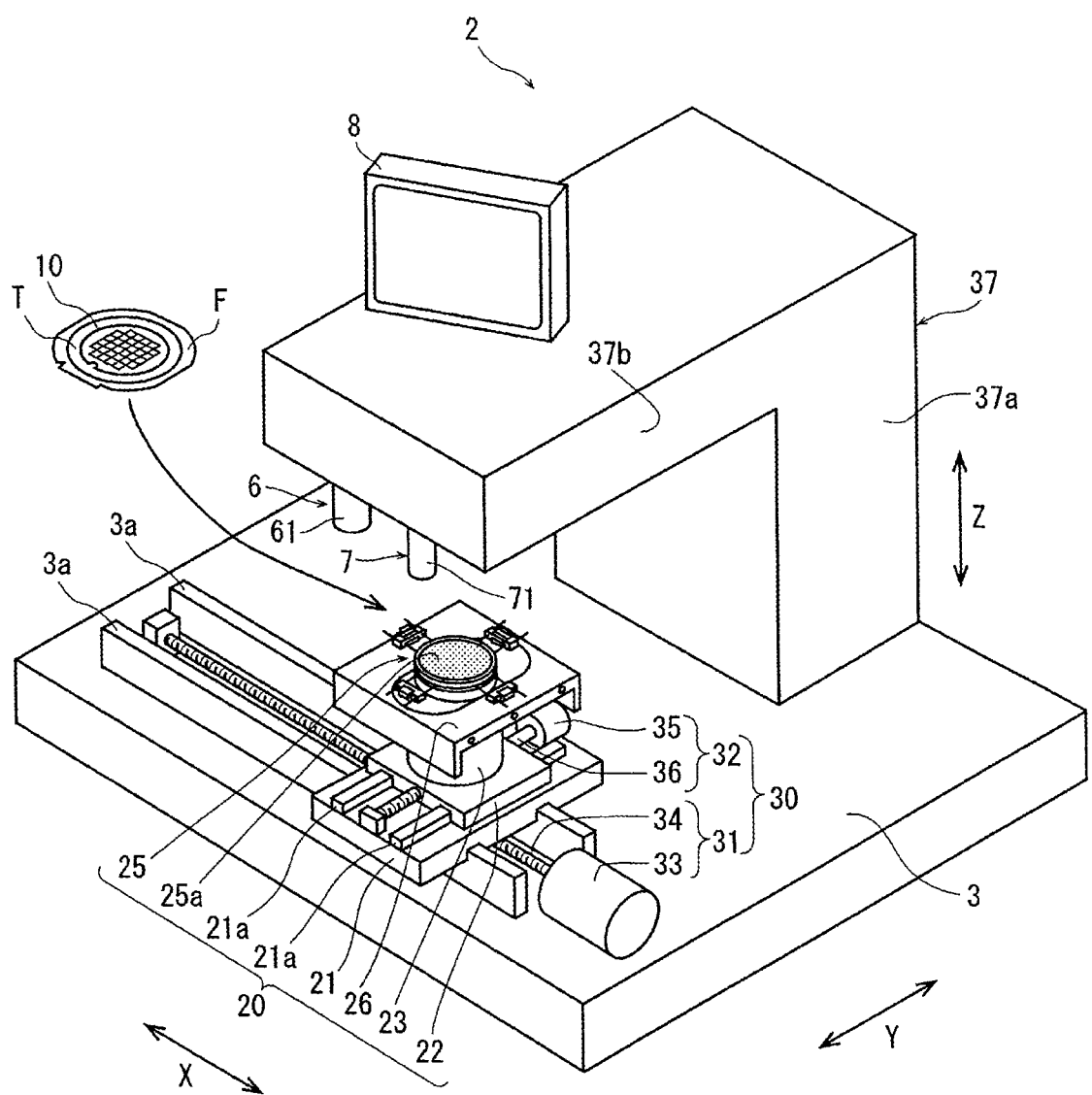
FIG. 1 is a general perspective view of a laser processing apparatus.

FIG. 1 illustrates a general perspective view of a laser processing apparatus 2 according to the present embodiment. As illustrated in the figure, a workpiece to be processed by the laser processing apparatus 2 according to the present embodiment is a disk-shaped wafer 10, and the workpiece is held by an annular frame F via an adhesive tape T.

The laser processing apparatus 2 includes a chuck table 25 that holds the wafer 10, a laser irradiating unit 6 that performs laser processing by irradiating the wafer 10 held by the chuck table 25 with a laser beam, a feed mechanism 30 that processing-feeds the chuck table 25 and the laser beam applied from the laser irradiating unit 6 relative to each other, an imaging unit 7 that serves as both a main imaging unit that images a region to be laser-processed and an auxiliary imaging unit that images processed grooves formed by laser processing and debris, and a display unit 8.

A holding unit 20 including the chuck table 25 includes a rectangular X-axis direction movable plate 21 mounted on a base 3 so as to be movable in an X-axis direction, a rectangular Y-axis direction movable plate 22 mounted so as to be movable in a Y-axis direction along guide rails 21a and 21a on the X-axis direction movable plate 21, a cylindrical column 23 fixed to the upper surface of the Y-axis direction movable plate 22, and a rectangular cover plate 26 fixed to an upper end of the column 23. The chuck table 25 is a circular member extending upward through an elongated hole formed in the cover plate 26. The chuck table 25 is configured to be rotatable by rotation driving means not illustrated. The chuck table 25 has a holding surface 25a formed of a porous material having air permeability and defined by the X-axis direction and the Y-axis direction. The holding surface 25a is connected to suction means not illustrated by a flow passage passing through the column 23. Incidentally, the X-axis direction is a direction indicated by an arrow X in FIG. 1, and the Y-axis direction is a direction indicated by an arrow Y and is a direction orthogonal to the X-axis direction. A plane defined by the X-axis direction and the Y-axis direction is substantially horizontal.

The feed mechanism 30 includes an X-axis moving mechanism 31 that performs processing feed by moving the chuck table 25 of the holding unit 20 and the laser beam applied from the laser irradiating unit 6 relative to each other in the X-axis direction, and a Y-axis moving mechanism 32 that moves the chuck table 25 and the laser beam applied from the laser irradiating unit 6 relative to each other in the Y-axis direction. The X-axis moving mechanism 31 includes a ball screw 34 extending in the X-axis direction on the base 3 and a motor 33 coupled to one end portion of the ball screw 34. A nut portion (not illustrated) of the ball screw 34 is formed on the lower surface of the X-axis direction movable plate 21. The X-axis moving mechanism 31 converts a rotary motion of the motor 33 into a rectilinear motion by the ball screw 34, and transmits the rectilinear motion to the X-axis direction movable plate 21. The X-axis moving mechanism 31 thereby advances or retreats the X-axis direction movable plate 21 in the X-axis direction along guide rails 3a and 3a on the base 3. The Y-axis moving mechanism 32 includes a ball screw 36 extending in the Y-axis direction on the X-axis direction movable plate 21 and a motor 35 coupled to one end portion of the ball screw 36. A nut portion (not illustrated) of the ball screw 36 is formed on the lower surface of the Y-axis direction movable plate 22. The Y-axis moving mechanism 32 converts a rotary motion of the motor 35 into a rectilinear motion by the ball screw 36, and transmits the rectilinear motion to the Y-axis direction movable plate 22. The Y-axis moving mechanism 32 thereby advances or retreats the Y-axis direction movable plate 22 in the Y-axis direction along the guide rails 21a and 21a on the X-axis direction movable plate 21.

Erected on the back side of the holding unit 20 is a frame body 37 that includes a vertical wall portion 37a extending upward (Z-axis direction) from the upper surface of the base 3 and a horizontal wall portion 37b extending horizontally. The horizontal wall portion 37b houses optical systems of the laser irradiating unit 6 and the imaging unit 7. A condenser 61 that constitutes the laser irradiating unit 6 is disposed on the lower surface of a distal end of the horizontal wall portion 37b. An objective lens 71 of the imaging unit 7 is disposed at a position at an interval from the condenser 61 in the X-axis direction. The above-described laser irradiating unit 6 is means for applying a laser beam of a wavelength absorbable by the wafer 10. The laser irradiating unit 6 is set to laser processing conditions for performing ablation processing on the top surface of the wafer 10. The objective lens 71 illustrated in the figure is an objective lens housed within a cylindrical case. The display unit 8 is disposed on the horizontal wall portion 37b. The laser irradiating unit 6, the imaging unit 7, the display unit 8, the moving means 30, and the like described above are electrically connected to a control unit to be described later, and are controlled on the basis of instruction signals given from the control unit to perform laser processing on the wafer 10.

Figure 2:
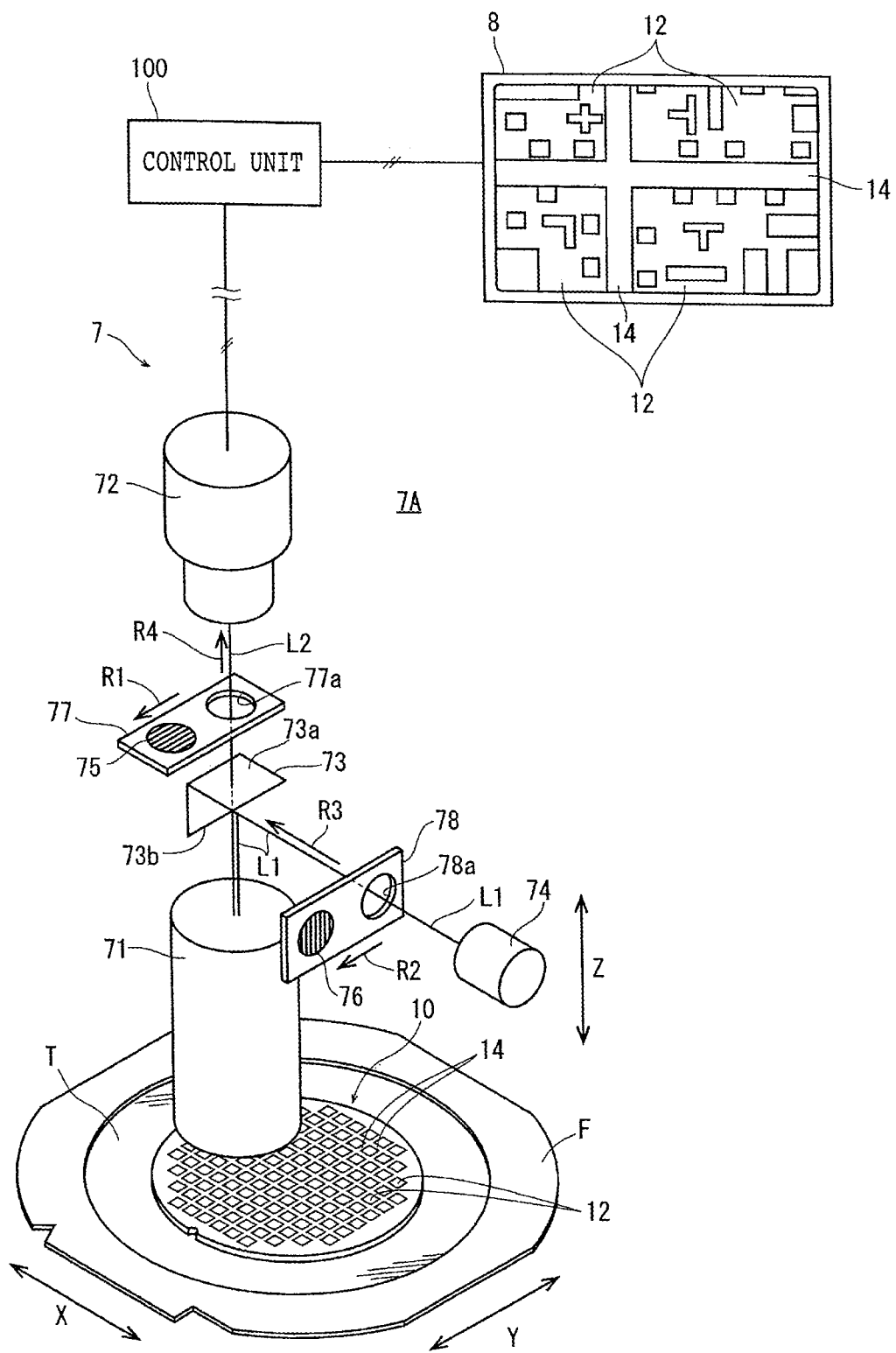
FIG. 2 is a perspective view illustrating a state in which an imaging unit fitted to the laser processing apparatus illustrated in FIG. 1 functions as a main imaging unit.

The imaging unit 7 according to the present embodiment will be described with reference to FIG. 2. FIG. 2 illustrates the optical system of the imaging unit 7 which is housed in the horizontal wall portion 37b of the frame body 37 omitted for the convenience of description. As described above, the imaging unit 7 according to the present embodiment serves as both a main imaging unit 7A that images a region to be laser-processed and an auxiliary imaging unit 7B (see FIG. 4) that images grooves formed by laser processing and debris, as will be described later. FIG. 2 illustrates a state in which the imaging unit 7 functions as the main imaging unit 7A that images the region to be laser-processed.

As illustrated in FIG. 2, the imaging unit 7 includes the objective lens 71, a camera 72 that generates an image via the objective lens 71, a half-silvered mirror 73 disposed between the camera 72 and the objective lens 71, a light source 74 that illuminates the wafer 10 held on the above-described chuck table 25 via the half-silvered mirror 73 and the objective lens 71, a first polarizing plate 75 disposed between the camera 72 and the half-silvered mirror 73, and a second polarizing plate 76 disposed between the light source 74 and the half-silvered mirror 73. The light source 74 is, for example, a light source that applies visible light L1. The first polarizing plate 75 is a polarizing plate whose polarization axis is set in a predetermined direction (Y-axis direction in the present embodiment), and the first polarizing plate 75 is a polarizing plate that transmits only light vibrating in the Y-axis direction when light passes through the first polarizing plate 75. On the other hand, the polarization axis of the second polarizing plate 76 in the embodiment illustrated in FIG. 2 is set in an upward-downward direction indicated by an arrow Z. Thus, the second polarizing plate 76 is disposed such that the polarization axis of light applied from the light source 74, passed through the second polarizing plate 76, and reflected by the half-silvered mirror 73 is rotated by 90 degrees with respect to the polarization axis of the first polarizing plate 75, that is, the polarization axis of the light is in the X-axis direction orthogonal to the Y-axis direction.

The camera 72 is connected to a control unit 100. An image transmitted from the camera 72 to the control unit 100 is displayed on the display unit 8. It is to be noted that, while an arrangement is made in the above-described embodiment such that the polarization axis of the light after the visible light L1 applied from the light source 74 is passed through the second polarizing plate 76 and reflected by the half-silvered mirror 73 is rotated by 90 degrees with respect to the polarization axis of the first polarizing plate 75, the present invention is not limited to this. It suffices for the polarization axis of the light after the visible light L1 is passed through the second polarizing plate 76 and reflected by the half-silvered mirror 73 to be rotated as appropriate with respect to the polarization axis of the first polarizing plate 75 according to the state of the top surface of the wafer 10. That is, it suffices for the polarization axis of the second polarizing plate 76 to be rotated by a required angle with respect to the polarization axis of the first polarizing plate 75, and the polarization axis of the first polarizing plate 75 and the polarization axis of the second polarizing plate 76 are not limited to being set so as to be along the X-axis direction and the Y-axis direction.

Further, the first polarizing plate 75 of the imaging unit 7 in the present embodiment is held by a first polarizing plate holding plate 77, and the second polarizing plate 76 is held by a second polarizing plate holding plate 78. The first polarizing plate holding plate 77 and the second polarizing plate holding plate 78 are held by a holding mechanism not illustrated, and are configured to be movable in a horizontal direction. Further, an opening portion 77a is formed in the first polarizing plate holding plate 77. When the first polarizing plate holding plate 77 is moved in a direction indicated by an arrow R1, the first polarizing plate holding plate 77 can be selectively moved from an action position at which the first polarizing plate 75 acts at a time that the camera 72 images the wafer 10 held on the chuck table 25 to a non-action position at which the first polarizing plate 75 does not act.

Similarly to this, an opening portion 78a is formed also in the second polarizing plate holding plate 78. When the second polarizing plate holding plate 78 is moved in a direction indicated by an arrow R2, the second polarizing plate holding plate 78 can be selectively moved from an action position at which the second polarizing plate 76 acts such that the light L1 passes through the second polarizing plate 76 at a time that the light L1 is applied from the light source 74 to a non-action position at which the second polarizing plate 76 does not act. In the imaging unit 7 illustrated in FIG. 2, both the first polarizing plate holding plate 77 and the second polarizing plate holding plate 78 described above are moved to the above-described non-action positions. The imaging unit 7 is thereby set in a state of functioning as the main imaging unit 7A that images the region to be laser-processed by the camera 72.

The laser processing apparatus 2 according to the present embodiment generally has the configuration as described above. Functions and actions of the present embodiment will be described in the following.

When laser processing is to be performed by using the laser processing apparatus 2 according to the present embodiment, as illustrated in FIG. 1, the wafer 10 is first transported to the laser processing apparatus 2, is mounted on the chuck table 25 of the holding unit 20, and is sucked and held by the chuck table 25. As illustrated in the figure, the wafer 10 has a plurality of devices 12 formed on the top surface thereof so as to be demarcated by a plurality of intersecting planned dividing lines 14. Next, the wafer 10 held on the chuck table 25 is positioned directly below the objective lens 71 of the imaging unit 7 by actuating the above-described feed mechanism 30. At this time, as described with reference to FIG. 2, the first polarizing plate holding plate and the second polarizing plate holding plate 78 of the imaging unit 7 are positioned at the non-action positions, and thus the imaging unit 7 is set in a state of functioning as the main imaging unit 7A for imaging a region to be laser-processed.

Next, as illustrated in FIG. 2, the visible light L1 applied from the light source 74 is passed through the opening portion 78a of the second polarizing plate holding plate 78 set at the non-action position, is reflected by a reflecting surface 73b of the half-silvered mirror 73 as indicated by an arrow R3, and is guided to the objective lens 71 side. The visible light L1 reflected by the reflecting surface 73b of the half-silvered mirror 73 is reflected by the wafer 10 held on the chuck table 25, and becomes reflected light L2. The reflected light L2 is guided to the half-silvered mirror 73 via the objective lens 71, and is transmitted through the reflecting surface 73b and an upper surface 73a of the half-silvered mirror 73 (a part of the reflected light L2 is reflected to the light source 74 side).

Figure 3:
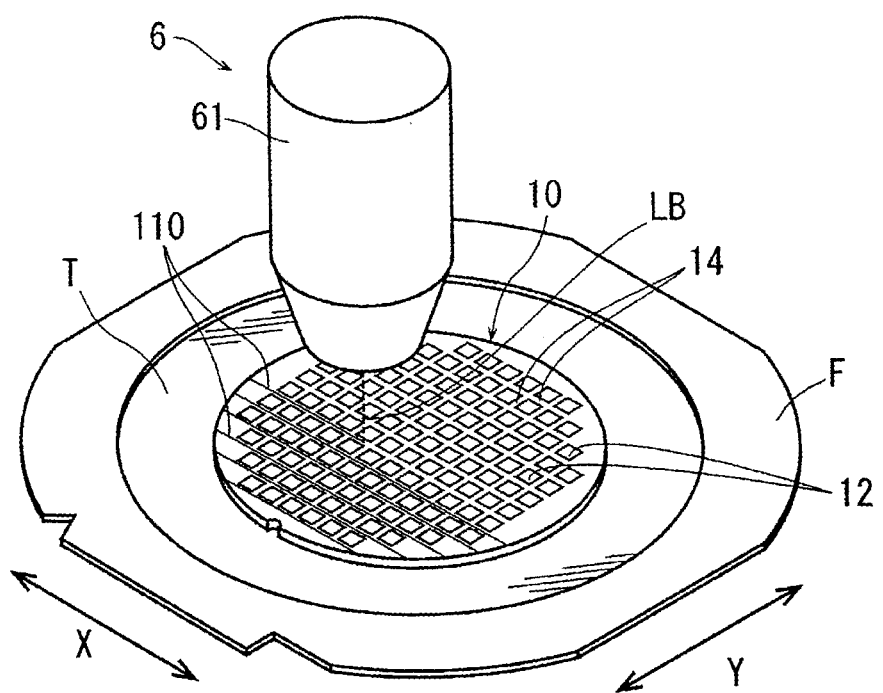
FIG. 3 is a perspective view illustrating a mode of a laser processing step.

Further, the reflected light L2 is passed through the opening portion 77a of the first polarizing plate holding plate 77, and is guided to the camera 72 as indicated by an arrow R4. The camera 72 thereby generates an image, and makes the image displayed on the display unit 8 via the control unit 100. As illustrated in FIG. 2, the image generated by the camera 72 includes a planned dividing line 14 as a region in which a processed groove is to be formed by laser processing, and the position of the planned dividing line 14 is detected. Next, the chuck table 25 is rotated by the above-described rotation driving means, the planned dividing line 14 is aligned with the X-axis direction, and the position of the region to be processed is stored in the control unit 100. An alignment step is then completed. After the alignment step is performed, a laser processing step to be described in the following with reference to FIG. 3 is performed.

The condenser 61 of the laser irradiating unit 6 is positioned directly above a processing start position of the planned dividing line 14 in a first direction by moving the chuck table 25 on the basis of the position information of the planned dividing line 14 detected in the above-described alignment step. A condensing point of the laser beam LB is positioned and applied onto the planned dividing line 14 of the wafer 10, and a processed groove 110 is formed by processing-feeding the wafer 10 in the X-axis direction together with the above-described chuck table 25, and thus performing ablation processing along the predetermined planned dividing line 14 in the first direction of the wafer 10. After the processed groove 110 is formed along the predetermined planned dividing line 14, the wafer 10 is indexing-fed by an interval of the planned dividing lines 14 in the Y-axis direction, and an unprocessed planned dividing line 14, which is adjacent in the Y-axis direction and is in the first direction, is positioned directly below the condenser 61. Then, in a similar manner to that described above, the condensing point of the laser beam LB is positioned and applied onto the planned dividing line 14 of the wafer 10, and a processed groove 110 is formed by processing-feeding the wafer 10 in the X-axis direction. Processed grooves 110 are formed along all of the planned dividing lines 14 along the first direction by similarly processing-feeding the wafer 10 in the X-axis direction and the Y-axis direction. Next, the wafer 10 is rotated by 90 degrees, and an unprocessed planned dividing line 14 in a second direction orthogonal to the planned dividing lines 14 in the first direction in which the processed grooves 110 are already formed is aligned with the X-axis direction. Then, the condensing point of the laser beam LB is also positioned and applied onto the remaining planned dividing lines 14 in the second direction in a similar manner to that described above, and thus processed grooves 110 are formed along all of the planned dividing lines 14 formed on the top surface of the wafer 10. The laser processing step is thereby completed.

Figure 4:
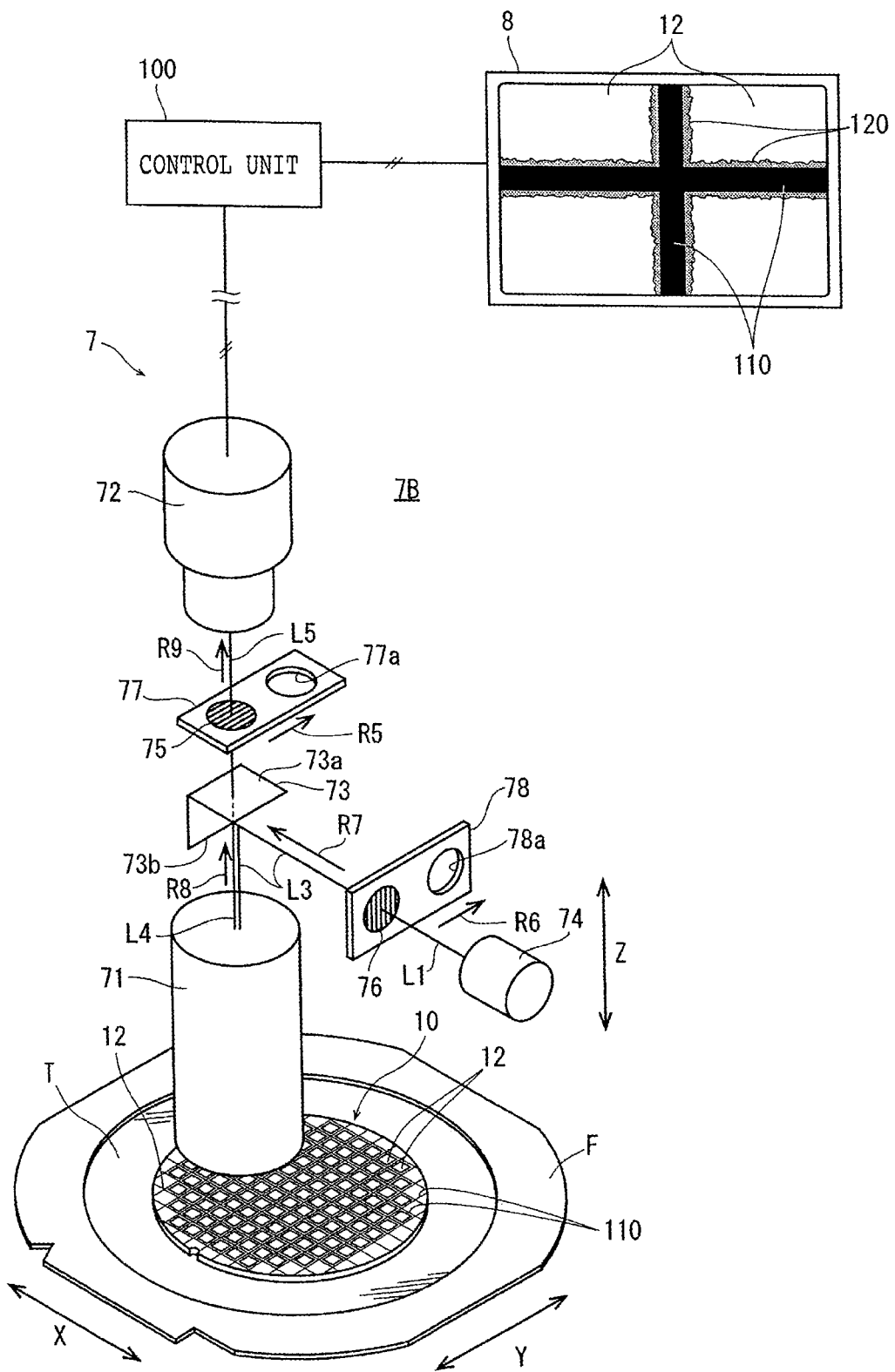
FIG. 4 is a perspective view illustrating a state in which the imaging unit illustrated in FIG. 2 functions as an auxiliary imaging unit.

After the laser processing step is completed as described above, a processed groove checking step to be described in the following is performed to check the finished quality of the processed grooves 110. When the processed groove checking step is to be performed, the chuck table 25 is moved by actuating the above-described feed mechanism 30, and thereby the wafer 10 is positioned directly below the objective lens 71 of the imaging unit 7. At this time, as illustrated in FIG. 4, the imaging unit 7 moves the first polarizing plate holding plate 77 to the action position by moving the first polarizing plate holding plate 77 in a direction indicated by an arrow R5, and moves the second polarizing plate holding plate 78 to the action position by moving the second polarizing plate holding plate 78 in a direction indicated by an arrow R6. The imaging unit 7 is thereby set in a state of functioning as the auxiliary imaging unit 7B suitable for imaging a processed groove 110 formed by the laser processing, and debris to be described later, which adheres to both sides of the processed groove 110, by imaging a laser-processed region of the wafer 10 held on the chuck table 25, that is, a region in which the processed groove 110 is formed.

After the wafer 10 in which the processed groove 110 is formed is positioned directly below the objective lens 71 of the imaging unit 7 set as the auxiliary imaging unit 7B as described above, the visible light L1 is applied from the light source 74. Only light L3 of a component, which vibrates in the upward-downward direction by passing through the second polarizing plate 76, of the visible light L1 travels in a direction indicated by an arrow R7, is guided to and reflected by the reflecting surface 73b of the half-silvered mirror 73, and is applied via the objective lens 71 to the region in which the processed groove 110 is formed in the wafer 10. The light L3 applied to the region including the processed groove 110 in the wafer 10 is reflected by the region including the processed groove 110 in the wafer 10, and becomes reflected light L4. The reflected light L4 travels in a direction indicated by an arrow R8 via the objective lens 71, and passes through the half-silvered mirror 73 (a part of the reflected light L4 is reflected by the reflecting surface 73b). The reflected light L4 passed through the half-silvered mirror 73 is guided to the first polarizing plate 75. Only passing light L5, which passes through the first polarizing plate 75, of the reflected light L4 travels in a direction indicated by an arrow R9. The camera 72 generates an image, and the image is displayed on the display unit 8 via the control unit 100.

Here, the above-described passing light L5 will be further described more specifically. As described above, the light L1 applied from the light source 74 passes through the second polarizing plate 76 whose polarization axis is set in the upward-downward direction (Z-axis direction). Thus, the plane of polarization of the light L3 reflected at the half-silvered mirror 73 is in a direction rotated by 90 degrees with respect to the polarization axis of the first polarizing plate 75, that is, the X-axis direction. In a case where the light L3 is regularly reflected on the wafer 10 when the light L3 is reflected on the wafer 10, the reflection of the light L3 remains in the X-axis direction without changing the direction of the plane of polarization of the reflected light. On the other hand, in a case where the light L3 is reflected by a part having a surface with small projections and depressions or the like on the wafer 10 when the light L3 is reflected on the wafer 10, the light L3 causes diffused reflection at the surface with the projections and depressions or the like, and the light L3 becomes reflected light including polarization planes in various directions. Here, when a component of the reflected light L4 regularly reflected on the wafer 10 in the present embodiment is guided to the first polarizing plate 75, the component of the reflected light L4 whose polarization plane is in the X-axis direction is blocked by the first polarizing plate 75 and cannot pass through because the polarization axis of the first polarizing plate 75 is oriented in the Y-axis direction. On the other hand, when the reflected light L4 includes components diffusely reflected on the wafer 10, the reflected light L4 includes components of light having polarization planes that are in the direction of the polarization axis of the first polarizing plate 75 (Y-axis direction) and are close to the Y-axis direction at a time that the reflected light L4 is guided to the first polarizing plate 75. Therefore, these pieces of reflected light pass through the first polarizing plate 75, reach the camera 72, and generate an image.

As illustrated in FIG. 4, in a case where a region in which a processed groove 110 is formed properly is irradiated with the light L3, the light L3 is mainly regularly reflected in the region, and forms reflected light with little diffused reflection. On the other hand, because debris formed on both sides of the processed groove 110 includes a surface of small projections and depressions, the light L3 applied to this region is diffusely reflected, and forms reflected light including light having polarization planes in various directions. When the reflected light L4 thus generated by the regular reflection and the diffused reflection is guided to the first polarizing plate 75, a reflected light component generated by the regular reflection is blocked, and only light whose polarization planes are in the Y-axis direction and close to the Y-axis direction in the reflected light generated by the diffused reflection at the debris forms the transmitted passing light L5. An image is generated by guiding the thus formed passing light L5 to the camera 72, and is displayed on the display unit 8 (processed groove checking step). As a result, as illustrated in FIG. 4, contrast between the processed groove 110 and the debris 120 becomes clear, and therefore the finished quality of the processed groove 110 can be checked excellently. Incidentally, the image displayed on the display unit 8 in FIG. 4 is illustrated as an image in reverse video for the convenience of description.

In the present embodiment, the first polarizing plate 75 and the second polarizing plate 76 are held by the first polarizing plate holding plate 77 and the second polarizing plate holding plate 78, are configured to be able to be selectively positioned at an action position and a non-action position, and are configured as one imaging unit 7 that serves as both the main imaging unit 7A and the auxiliary imaging unit 7B. A space for disposing the imaging unit is thereby prevented from becoming too large.

In the foregoing embodiment, one imaging unit 7 is configured to serve as both the main imaging unit 7A and the auxiliary imaging unit 7B. However, the present invention is not limited to this. The main imaging unit 7A and the auxiliary imaging unit 7B may be configured as independent and separate units, and the alignment step and the processed groove checking step described above may be performed by the main imaging unit 7A and the auxiliary imaging unit 7B configured separately from each other.

In addition, in the foregoing embodiment, an example in which laser processing is performed using the wafer 10 having the plurality of devices 12 formed on the top surface thereof so as to be demarcated by the plurality of intersecting planned dividing lines 14 has been illustrated. However, the present invention is not limited to this. What is called a dummy wafer having no devices 12 formed thereon may be used. Further, in the above-described embodiment, an example in which the polarization axis of the second polarizing plate 76 is rotated by 90 degrees with respect to the polarization axis of the first polarizing plate 75 has been illustrated. However, it is possible to obtain an effect of blocking reflected light regularly reflected by the top surface of the wafer 10 when the polarization axis of the second polarizing plate 76 is rotated by a required angle, that is, more than zero degrees.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
   a chuck table configured to hold a wafer;
   a laser irradiating unit configured to perform laser processing by irradiating the wafer held on the chuck table with a laser beam;
   a feed mechanism configured to processing-feed the chuck table and the laser irradiating unit relative to each other;
   a main imaging unit configured to image a region to be laser-processed;
   an auxiliary imaging unit; and
   a display unit, wherein
   the auxiliary imaging unit includes
      an objective lens,
      a camera configured to generate an image via the objective lens,
      a half-silvered mirror disposed between the camera and the objective lens,
      a light source configured to illuminate the wafer held on the chuck table via the half-silvered mirror and the objective lens,
      a first polarizing plate disposed between the camera and the half-silvered mirror, and
      a second polarizing plate disposed between the light source and the half-silvered mirror, and
   the second polarizing plate is disposed such that a polarization plane of light applied from the light source, passed through the second polarizing plate, and reflected by the half-silvered mirror is rotated by a required angle with respect to a polarization axis of the first polarizing plate.

2. The laser processing apparatus according to claim 1, wherein
   the auxiliary imaging unit is configured to be able to image a processed groove formed by the laser processing and debris by imaging a laser-processed region of the wafer held on the chuck table.

3. The laser processing apparatus according to claim 1, wherein
   the first polarizing plate and the second polarizing plate constituting the auxiliary imaging unit are capable of being selectively positioned at an action position and a non-action position, and constitute the main imaging unit by being positioned at the non-action position.

4. The laser processing apparatus according to claim 1, wherein
   the required angle is 90 degrees.

* * * * *